United States Patent
Lee et al.

(10) Patent No.: US 9,419,268 B2
(45) Date of Patent: Aug. 16, 2016

(54) SECONDARY BATTERY AND CIRCUIT BOARD ASSEMBLY SUITABLE FOR SECONDARY BATTERY

(75) Inventors: Seongjoon Lee, Suwon-si (KR); Myungjun Lee, Suwon-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 592 days.

(21) Appl. No.: 12/886,509

(22) Filed: Sep. 20, 2010

(65) Prior Publication Data

US 2011/0123838 A1   May 26, 2011

(30) Foreign Application Priority Data

Nov. 23, 2009   (KR) .................. 10-2009-0113134

(51) Int. Cl.
| | | |
|---|---|---|
| *H01M 10/02* | (2006.01) | |
| *H01M 10/50* | (2006.01) | |
| *H05K 1/16* | (2006.01) | |
| *H01M 2/34* | (2006.01) | |
| *H01M 2/02* | (2006.01) | |

(Continued)

(52) U.S. Cl.
CPC ............ *H01M 2/348* (2013.01); *H01M 2/0207* (2013.01); *H01M 2/34* (2013.01); *H01M 10/425* (2013.01); *H05K 1/0201* (2013.01); *H01M 10/0525* (2013.01); *H01M 2200/00* (2013.01); *H01M 2200/10* (2013.01); *H05K 1/0206* (2013.01); *H05K 1/183* (2013.01); *H05K 2201/10022* (2013.01)

(58) Field of Classification Search
CPC ......... H01M 2/021; H01M 2/24; H01M 2/34; H01M 2200/00; H01M 2/348; H01M 10/425; H01M 2200/10; H05K 1/0201; H05K 1/0203; H05K 1/0204; H05K 1/0206; H05K 1/183
See application file for complete search history.

(56) References Cited

U.S. PATENT DOCUMENTS 6,027,535 A   *   2/2000   Eberle et al. ................... 361/690
6,414,847 B1 *   7/2002   Hutchison ........... H01L 23/3677
                                                                  165/185

(Continued)

FOREIGN PATENT DOCUMENTS

| GB | 2379553 | * | 3/2003 | ............ H01M 10/46 |
|---|---|---|---|---|
| JP | 2002124305 | | 4/2002 | |

(Continued)

OTHER PUBLICATIONS

Definition of "surround" by Merriam-Webster's Online Dictionary, http://www.merriam-webster.com/dictionary/surround, accessed May 12, 2015.*

(Continued)

*Primary Examiner* — Ula C Ruddock
*Assistant Examiner* — Amanda Barrow
(74) *Attorney, Agent, or Firm* — Robert E. Bushnell, Esq.

(57) ABSTRACT

Disclosed are a secondary battery and a circuit board assembly suitable for the secondary battery. The secondary battery includes a bare cell including an electrode terminal, a circuit board electrically connected to the electrode terminal and arranged on a top surface of the bare cell. The circuit board includes an installation part having a smaller thickness than rest of the circuit board. The secondary battery further includes a temperature device installed on the installation part of the circuit board to sense temperature variation of the bare cell.

19 Claims, 3 Drawing Sheets

(51) Int. Cl.
   *H01M 10/42* (2006.01)
   *H05K 1/02* (2006.01)
   *H01M 10/0525* (2010.01)
   *H05K 1/18* (2006.01)

(56) References Cited

U.S. PATENT DOCUMENTS

| | | | |
|---|---|---|---|
| 2003/0157399 A1 | 8/2003 | Ikeuchi et al. | |
| 2003/0165736 A1* | 9/2003 | Hiratsuka | 429/153 |
| 2004/0119149 A1* | 6/2004 | Yin Pang et al. | 257/678 |
| 2005/0140338 A1* | 6/2005 | Kim et al. | 320/150 |
| 2005/0266302 A1 | 12/2005 | Kim | |
| 2006/0044765 A1* | 3/2006 | Chen | H05K 1/0206 361/720 |
| 2006/0083984 A1* | 4/2006 | Oh et al. | 429/176 |
| 2006/0105237 A1* | 5/2006 | Oh | 429/180 |
| 2006/0275653 A1 | 12/2006 | Chang et al. | |
| 2007/0120250 A1* | 5/2007 | Fairchild | H01L 23/3677 257/712 |
| 2007/0154796 A1* | 7/2007 | Uh | 429/174 |
| 2007/0231682 A1* | 10/2007 | Aoyama et al. | 429/160 |
| 2007/0274052 A1* | 11/2007 | Andberg | H05K 3/0061 361/719 |
| 2008/0292955 A1* | 11/2008 | Byun | H01M 2/0207 429/163 |
| 2009/0002950 A1* | 1/2009 | Gertiser | H05K 1/0206 361/709 |
| 2009/0081485 A1* | 3/2009 | Heo | H01M 2/02 429/7 |
| 2009/0111013 A1* | 4/2009 | Jang | 429/163 |
| 2009/0191450 A1* | 7/2009 | Kim | H01M 2/021 429/97 |
| 2009/0297942 A1* | 12/2009 | Jang | H01M 2/021 429/178 |

FOREIGN PATENT DOCUMENTS

| | | | | |
|---|---|---|---|---|
| JP | 2002-260608 | | 9/2002 | |
| JP | 2006-210409 | | 8/2006 | |
| JP | 2007-280643 | | 10/2007 | |
| KR | 20030038560 A | | 5/2003 | |
| KR | 10-2007-0091880 | * | 9/2007 | H01M 2/10 |
| KR | 100867923 B | | 4/2008 | |

OTHER PUBLICATIONS

English Translation of Korean Office Action issued by KIPO, on Mar. 25, 2011, corresponding to KR 10-2009-0113134.

* cited by examiner

SECONDARY BATTERY AND CIRCUIT BOARD ASSEMBLY SUITABLE FOR SECONDARY BATTERY

CLAIM OF PRIORITY

This application makes reference to, incorporates into this specification the entire contents of, and claims all benefits accruing under 35 U.S.C. §119 from an application earlier filed in the Korean Intellectual Property Office on Nov. 23, 2009 and there duly assigned Serial No. 10-2009-0113134.

BACKGROUND OF THE INVENTION

1. Field of Invention

Embodiments relate to a secondary battery and a circuit board assembly suitable for the secondary battery.

2. Description of the Related Art

Lithium ion secondary batteries are widely used because they have high nominal voltage and high energy density per unit weight and per unit volume.

In a lithium ion secondary battery, lithium based oxide is typically used as a coating portion of a positive electrode plate, and a carbon material is used as a coating portion of a negative electrode plate. Non-aqueous liquid electrolyte formed of an organic solvent, or solid high polymer electrolyte may be used for a lithium ion secondary battery. A secondary battery including the latter solid high polymer electrolyte may be classified as a lithium ion polymer battery.

In addition, lithium ion batteries may be classified into cylinder type batteries, prismatic type batteries, and pouch type batteries according to fabricated shapes.

When an inner temperature of a secondary battery is increased over a predetermined level, a temperature device senses the temperature and makes the battery electrically open circuit. Thus, the secondary battery is protected from damages or accidents due to malfunction of the secondary battery.

However, in the related art, conductive tabs are connected to both ends of a temperature device. Thus, the conductive tabs should be bent several times. This makes a process complicated, and electrical insulating of the conductive taps is required.

SUMMARY OF THE INVENTION

Embodiments are directed to a secondary battery and a circuit board assembly suitable for the secondary battery, which substantially overcome one or more of the problems due to the limitations and disadvantages of the related art.

It is therefore a feature of an embodiment to provide a secondary battery on which a temperature device is effectively installed, and a circuit board assembly suitable for the secondary battery.

It is a feature of another embodiment to provide a secondary battery, which has a simple installation structure for a temperature device and effectively senses temperature, and a circuit board assembly suitable for the secondary battery.

At least one of the above and other features and advantages may be realized by providing a secondary battery including a bare cell, a circuit board, and a temperature device. The bare cell includes an electrode terminal, and generates electricity. The circuit board is electrically coupled to the electrode terminal and arranged on a top surface of the bare cell. The circuit board includes an installation part having a smaller thickness than rest of the circuit board. The temperature device is installed on the installation part of the circuit board to sense temperature of the bare cell.

The install part may include a recess or has through holes. The through holes may be formed at a regular interval, and are covered by the temperature device. The secondary battery may further include a thermal conductive material layer disposed in the recess or is disposed on inner surfaces of the through holes.

The secondary battery may further include at least one circuit device mounted on a surface of the circuit board.

The secondary battery may further include a terrace that protrudes upwards from the bare cell and covers a portion of the electrode terminal. The circuit board may be installed on the terrace.

The circuit board may include an insulating board formed of electrically insulating material.

The secondary battery may further include a conductive tab installed on the circuit board. The circuit board being electrically connected with the conductive tab. The temperature device may electrically connect the electrode terminal to the conductive tab. The temperature device is capable of cutting an electric current path between the electrode terminal and the conductive tab if a temperature of the bare cell is higher than a predetermined level.

At least one of the above and other features and advantages may be realized by providing a secondary battery including: a bare cell including an electrode terminal, a circuit board arranged on a top surface of the bare cell, a first conductive tab installed in the circuit board, and a temperature device. The bare cell generates electricity. The circuit board includes an installation part having a higher thermal conductivity than rest of the circuit board. The temperature device is installed on the installation part to sense temperature of the bare cell. The temperature device electrically connects the electrode terminal to the first conductive tab.

The install part may include a recess or have a through hole.

The secondary battery may further include a second conductive tab installed on the circuit board. The second conductive tab is electrically coupled to the electrode terminal. The temperature device electrically connects the second conductive tab to the first conductive tab.

The temperature device may be capable of cutting an electric current path between the first and second conductive tabs if a temperature of the bare cell is higher than a predetermined level.

At least one of the above and other features and advantages may be realized by providing a circuit board assembly including: an electrically insulating board, a first conductive tab and a second conductive tab installed in the electrically insulating board, and a temperature device. The electrically insulating board includes an installation part having a smaller thickness than rest of the electrically insulating board. The temperature device is installed on the installation part. The temperature device electrically connects the first conductive tab to the second conductive tab.

The install part may include a recess or have through holes.

The temperature device may be capable of cutting an electric current path between the first and second conductive tabs if a temperature of the first or second conductive tab is higher than a predetermined level.

BRIEF DESCRIPTION OF THE DRAWINGS

A more complete appreciation of the invention, and many of the attendant advantages thereof, will be readily apparent as the same becomes better understood by reference to the following detailed description when considered in conjunc

DETAILED DESCRIPTION OF THE INVENTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

Figure 1:
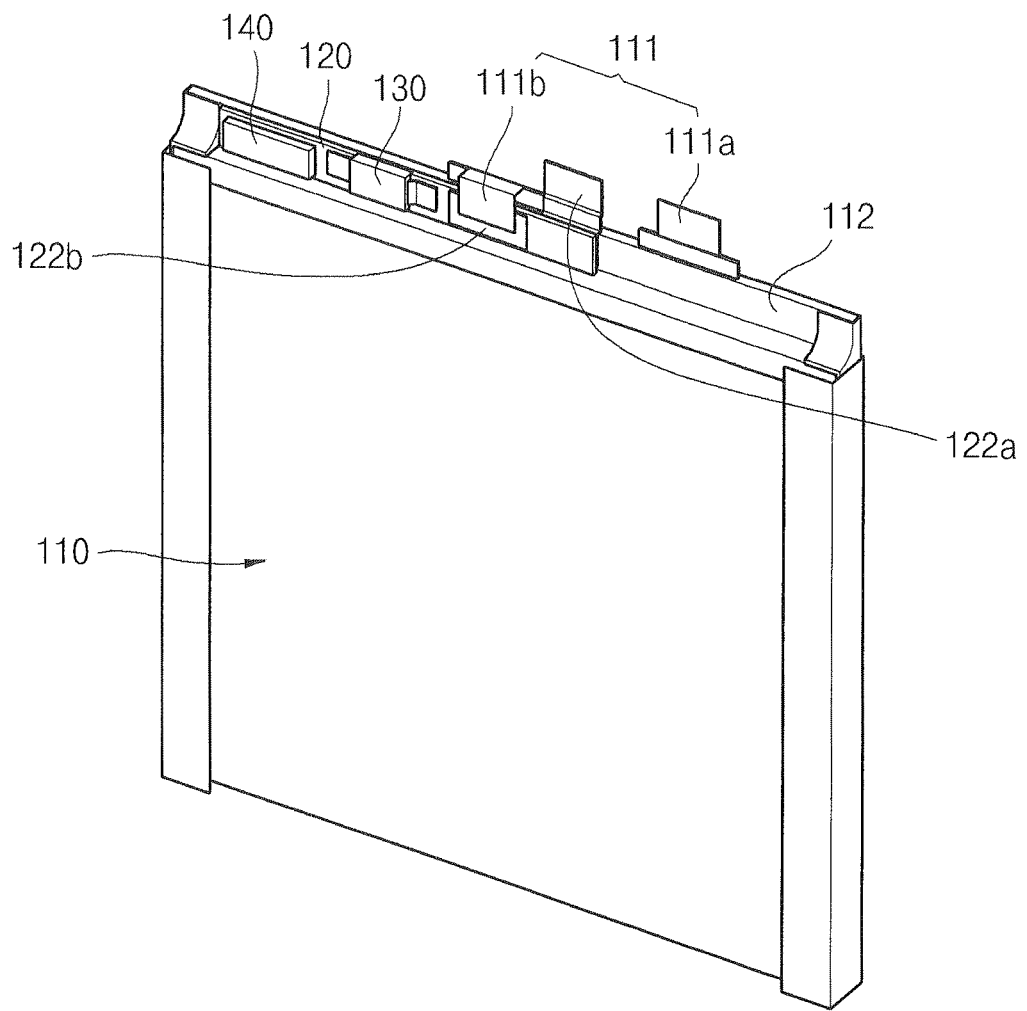
- FIG. 1 is a perspective view illustrating a secondary battery according to an embodiment.
Figure 2:
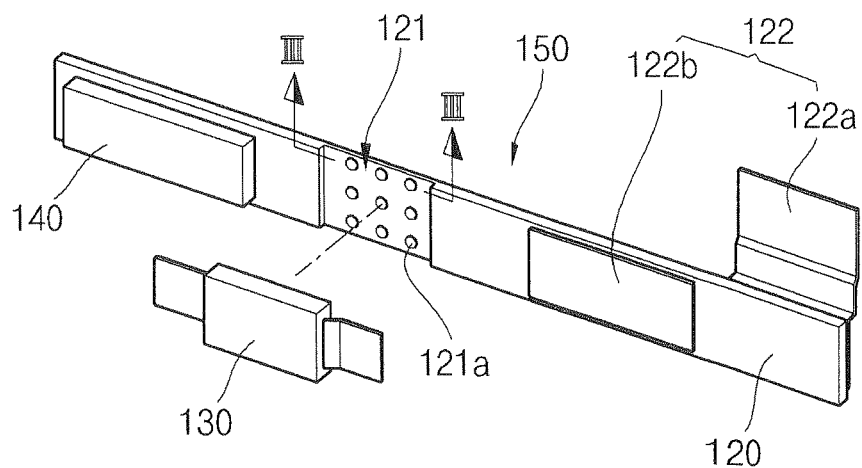
FIG. 2 is an exploded perspective view illustrating a part of the secondary battery of FIG. 1.

Hereinafter, embodiments will be described in detail with reference to the accompanying drawings. FIG. 1 is a perspective view illustrating a secondary battery according to an embodiment. FIG. 2 is an exploded perspective view illustrating a part of the secondary battery of FIG. 1.

Referring to FIGS. 1 and 2, the secondary battery includes a bare cell 110, a circuit board 120, and a temperature device 130.

The bare cell 110 may include an electrode assembly (not shown), which produces electricity, and an electrode terminal 111. The bare cell 110 shown in FIG. 1 is exemplified as a pouch type bare cell. The electrode assembly is formed by sequentially stacking a positive electrode plate, a separator, and a negative electrode plate, and by being wound in a jelly roll shape. The electrode assembly is stored in a case to form the bare cell 110.

The electrode terminal 111 extends from the electrode assembly of the bare cell 110 to the outside. The electrode terminal 111 may include a first electrode terminal 111a and a second electrode terminal 111b.

The first electrode terminal 111a may be electrically connected to one of a positive electrode plate or negative electrode plate to have a positive or negative polarity, respectively. The second electrode terminal 111b may be electrically connected to another of the positive electrode plate or negative electrode plate, which is not connected to the first electrode terminal 111a. The second electrode terminal 111b has electrically opposite polarity to the first electrode terminal 111a. The second electrode terminal 111b may be bent over a circuit board 120, as shown in FIG. 1.

The circuit board 120 may be placed on a terrace 112 arranged on a top surface of the bare cell 110. The terrace 112 protrudes upwards from the bare cell 110. The terrace 112 covers portions of the first and second electrode terminals 111a and 111b. As shown in FIG. 1, the second conductive tab 122b is mounted on the circuit board 120, and the second electrode terminal 111b is bent over the circuit board 120 to be electrically connected to the second conductive tab 122b.

The circuit board 120 may have an insulating board formed of an electrically insulating material and may include circuits formed in the insulating board. The circuit board may have a rectangular parallelepiped shape.

Since the circuit board 120 includes an insulating board, a process of insulating the circuit board 120 and the bare cell 110 is unnecessary. The circuit board 120 may extend along a predetermined direction in correspondence with the shape of the terrace 112.

A conductive tab 122 includes first and second conductive tabs 122a and 122b, and is mounted on the circuit board 120. Via the conductive tab 122, the electrode terminal 111 is connected to the circuits of the circuit board 120.

An installation part 121 is disposed at a portion of the circuit board 120. The installation part 121 has a smaller thickness than the rest of the circuit board 120. The installation part 121 functions as a heat transfer part. Therefore, the heat transfer rate of the installation part 121 is higher than that of other portion of the circuit board 120. Herein, the thickness of the circuit board 120 is defined as a distance between a side surface of the circuit board, on which the temperature device 130 is installed, and an opposite side surface of the circuit board 120. The installation part 121 may have through holes 121a as shown in FIG. 2. Even when through holes 121a are provided in the installation part 121 as illustrated in FIG. 2, the installation part 121 has the smaller thickness.

A single through hole or a plurality of through holes 121a may be provided in the installation part 121. The through holes 121a are distributed in an area corresponding to an area occupied by a temperature device 130. The through holes may be uniformly distributed at a regular interval, e.g., in a lattice as illustrated in FIG. 2.

The temperature device 130 is a secondary protective device that senses temperature variation of the bare cell 110. If the temperature of the bare cell 110 is higher than a predetermined temperature, the temperature device 130 makes the bare cell 110 electrically open. For example, the temperature device 130 may be a thermal cut off (TCO) device or a positive temperature coefficient (PTC) device. The temperature device 130 is electrically connected to the second conductive tab 122b through a circuit provided to the circuit board 120. The temperature device 130 is also electrically connected to the first conductive tab 122a through another circuit. Because the second electrode terminal 111b is electrically connected to the second conductive tab 122b, an electric current path is formed from the second electrode terminal 111b to the second conductive tab 122b, and to the first conductive tab 122a through the temperature device 130. Accordingly, the temperature device 130 can shut off electric current that flows from the second electrode terminal 111b to the first conductive tab 122a. In other words, the temperature device 130 is capable of cutting an electric current path between the first and second conductive tabs 122a and 122b if a temperature of the bare cell is higher than a predetermined level.

The first conductive tab 122a and the first electrode tab 111a form terminals of the secondary battery, through which an external device is electrically coupled.

The temperature device 130 is installed on the circuit board 120 at the position of the relatively thin installation part 121. Thus, resistance of heat transfer due to the circuit board 120 is decreased, so that the temperature device 130 effectively detects heat from the bare cell 110. Since the circuit board 120 provided with the temperature device 130 is installed on the terrace 112, temperature variation of the bare cell 110 is sensed more effectively. This is because relatively a large amount of heat, which is produced in the bare cell 110, is transferred through the electrode terminal 111 and passes through the terrace 112.

A circuit device 140 other than the temperature device 130 may be installed on the circuit board 120. The circuit device 140 may be a protective circuit for preventing overcharge/overdischarge of the bare cell 110.

If the circuit device 140 is mounted on the circuit board 120, or if a protective circuit is provided to the circuit device 140, a protective circuit module (PCM) may be unnecessary, or the size thereof may be decreased. For example, a switching device such as a field effect transistor device (FET) or an integrated circuit (IC) may be used as the circuit device 140. Alternatively, the circuit device 140 may be installed on the other protective circuit module instead of the circuit board 120. The circuit board 120 provided with the temperature device 130 is referred to as a circuit board assembly 150.

Figure 3:
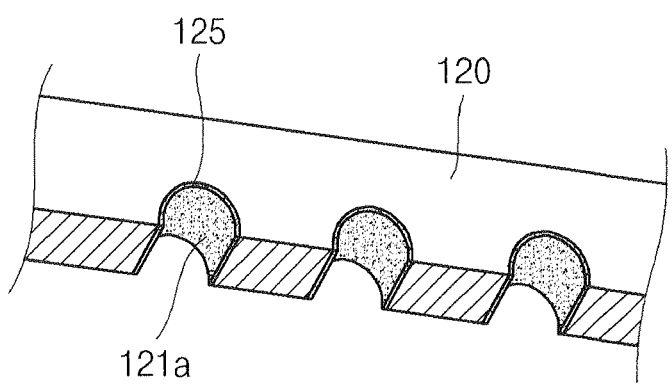
FIG. 3 is a cross sectional view taken along line of FIG. 2.

FIG. 3 is a cross sectional view taken along line of FIG. 2. Referring to FIG. 3, a thermal conductive material layer 125 is disposed on inner surfaces of the through holes 121a formed in the installation part 121 of the circuit board 120.

The thermal conductive material layer 125 may be formed of a material having high thermal conductivity, such as copper and aluminum. The thermal conductive material layer 125 may be formed by powdering and applying the material such as copper and aluminum on the inner surfaces of the through holes 121a, or by fitting ring shaped thin plate formed of one of these materials into the through holes 121a. Since the thermal conductive material layer 125 is formed on the installation part 121, the efficiency of heat transfer from the bare cell 110 to the temperature device 130 through the installation part 121 is improved.

Meanwhile, the thermal conductive material layer 125 may be formed by filling totally the through holes 121a although it is not separately depicted in drawings. In this case the efficiency of heat transfer from the bare cell 110 to the temperature device 130 through the installation part 121 is more improved.

Figure 4:
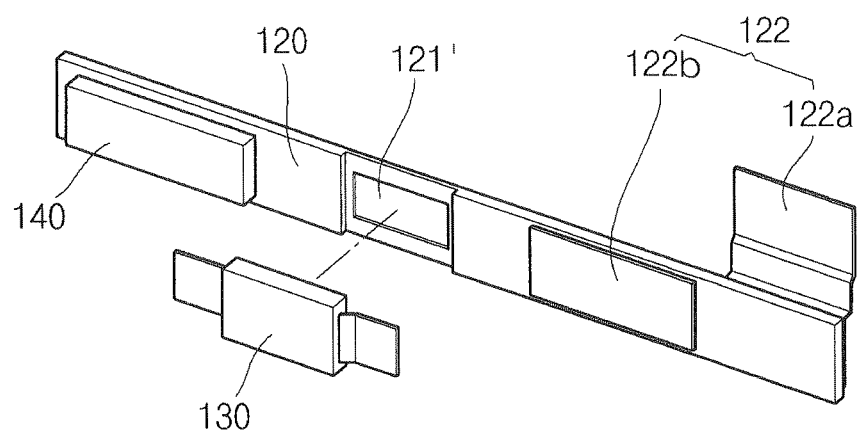
FIG. 4 is an exploded perspective view illustrating a part of the secondary battery of FIG. 1 according to another embodiment.

FIG. 4 is an exploded perspective view illustrating a part of the secondary battery of FIG. 1 according to another embodiment.

The current embodiment is the same as the previous one except that an installation part 121' is different from the installation part 121.

The installation part 121' is formed by recessing a predetermined portion of the circuit board 120. In other words, the installation part 121' has a recess that does not penetrate the circuit board 120. The recess may be provided to each of both opposite surfaces of the circuit board 120 at positions corresponding to each other. Alternatively, the recesses provided to both the opposite surfaces may be disposed at positions that do not correspond to each other. Although the single recess is exemplified in FIG. 4, a plurality of recesses that are spaced apart from each other may be provided to the surface of the circuit board 120. Having the recess instead of through holes may increase structural strength of the circuit board 120.

The thermal conductive material layer 125 of FIG. 3 may be formed on the recess of the installation part 121'. The thermal conductive material layer 125 may improve the efficiency of heat transfer from the bare cell 110 to the temperature device 130 through the installation part 121'.

Figure 5:
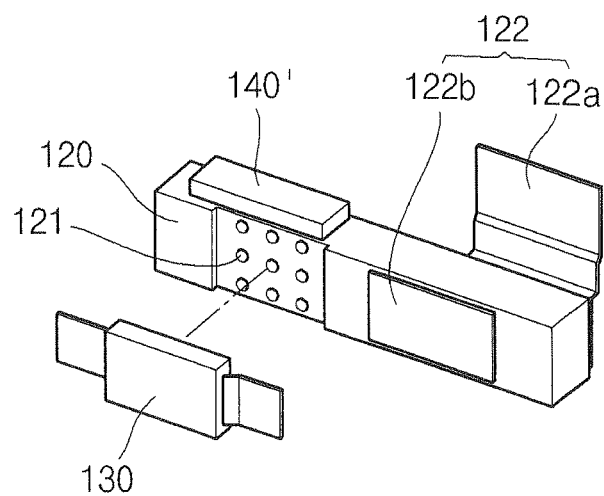
FIG. 5 is an exploded perspective view illustrating a part of the secondary battery of FIG. 1 according to another embodiment.

FIG. 5 is an exploded perspective view illustrating a part of the secondary battery of FIG. 1 according to another embodiment. Referring to FIG. 5, the length of the circuit board 120 is decreased, but the thickness of the circuit board 120 is increased.

A circuit device 140' may be installed on a top surface of the circuit board 120 having an increased thickness.

Thus, although the length of the circuit board 120 is decreased, a necessary device can be mounted on the circuit board 120.

The efficiency of heat transfer may decrease because of the increase of the thickness of the circuit board 120, but the installation part 121 sufficiently compensates for the decrease in heat transfer efficiency from the bare cell 110 to the temperature device 130.

After the circuit board 120, on which the temperature device 130 is mounted, is connected to the bare cell 110 as described above, a protective circuit module, a top case, and a bottom case may be installed on the bare cell 110. In addition, a label that is a metal sheet may be attached to the outer surface of the bare cell 110.

According to the embodiment, the temperature device can be easily installed using the circuit board.

In addition, temperature variation of the bare cell can be sensed more effectively through the structure of the installation part.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A secondary battery comprising:
a bare cell including a case, an electrode assembly stored in the case and an electrode terminal coupled to the electrode assembly, the electrode assembly generating electricity, the electrode terminal including a first electrode terminal and a second electrode terminal, both of which extend out of the case through a top surface of the case;
a terrace directly contacting the top surface of the case, the terrace covering a portion of the first electrode terminal and covering a portion of the second electrode terminal, the terrace spanning an entire length of the top surface of the case, the length of the top surface being defined as the longest dimension of the top surface of the case, the first electrode terminal protruding out of the terrace to be coupled to an external device;
a circuit board electrically coupled to the second electrode terminal, the circuit board directly disposed on the terrace, the circuit board including an installation part having a smaller thickness than the rest of the circuit board, the smaller thickness being formed along a direction parallel to the top surface of the case and perpendicular to the length of the top surface; and
a temperature device installed on the installation part of the circuit board to sense the temperature of the bare cell, wherein the installation part is interposed between the terrace and the temperature device, and the installation part comprises through holes penetrating the circuit board, wherein the temperature device and the terrace directly face each other via the through holes.

2. The secondary battery as claimed in claim 1, wherein the through holes are formed along a direction parallel to the top surface of the case and perpendicular to the length of the top surface.

3. The secondary battery as claimed in claim 2, wherein the through holes are formed at a regular interval, and are covered by the temperature device.

4. The secondary battery as claimed in claim 2, further comprising a thermal conductive material layer disposed on inner surfaces of the through holes.

5. The secondary battery as claimed in claim 1, further comprising at least one circuit device mounted on a surface of the circuit board.

6. The secondary battery as claimed in claim 1, wherein the circuit board includes an insulating board formed of an electrically insulating material.

7. The secondary battery as claimed in claim 1, further comprising a conductive tab installed on the circuit board, the circuit board being electrically connected with the conductive tab.

8. The secondary battery as claimed in claim 7, wherein the temperature device electrically connects the second electrode terminal to the conductive tab.

9. The secondary battery as claimed in claim 8, wherein the temperature device is capable of cutting an electric current path between the second electrode terminal and the conductive tab if a temperature of the bare cell is higher than a predetermined level.

10. A secondary battery comprising:
    a bare cell including a case, an electrode assembly stored in the case and an electrode terminal coupled to the electrode assembly, the electrode assembly generating electricity, the electrode terminal including a first electrode terminal and a second electrode terminal, both of which extend out of the case through a top surface of the case;
    a terrace directly contacting the top surface of the case, the terrace covering a portion of the first electrode terminal and covering a portion of the second electrode terminal, the terrace spanning an entire length of the top surface of the case, the length of the top surface being defined as the longest dimension of the top surface of the case, the first electrode terminal protruding out of the terrace to be coupled to an external device;
    a circuit board electrically coupled to the second electrode terminal, the circuit board directly disposed on the terrace, the circuit board including an installation part having a higher thermal conductivity than the rest of the circuit board, the installation part having a smaller thickness than the rest of the circuit board, the smaller thickness being formed along a direction parallel to the top surface of the case and perpendicular to the length of the top surface;
    a first conductive tab installed in the circuit board; and
    a temperature device installed on the installation part of the circuit board to sense the temperature of the bare cell, the temperature device electrically connecting the second electrode terminal to the first conductive tab, wherein the installation part is interposed between the terrace and the temperature device, and the installation part comprises through holes penetrating the circuit board, wherein the temperature device and the terrace directly face each other via the through holes.

11. The secondary battery as claimed in claim 10, wherein the through holes are formed along a direction parallel to the top surface of the case and perpendicular to the length of the top surface.

12. The secondary battery as claimed in claim 10, further comprising a second conductive tab installed on the circuit board, the second conductive tab being electrically coupled to the second electrode terminal, the temperature device electrically connecting the second conductive tab to the first conductive tab.

13. The secondary battery as claimed in claim 10, wherein the temperature device is capable of cutting an electric current path between the first and second conductive tabs if a temperature of the bare cell is higher than a predetermined level.

14. A secondary battery comprising:
    a bare cell including a case, an electrode assembly stored in the case and an electrode terminal coupled to the electrode assembly, the electrode assembly generating electricity, the electrode terminal including a first electrode terminal and a second electrode terminal, both of which extend out of the case through a top surface of the case;
    a terrace directly contacting the top surface of the case, the terrace covering a portion of the first electrode terminal and covering a portion of the second electrode terminal, the terrace spanning an entire length of the top surface of the case, the length of the top surface being defined as the longest dimension of the top surface of the case, the first electrode terminal protruding out of the terrace to be coupled to an external device;
    a circuit board electrically coupled to the second electrode terminal, the circuit board directly disposed on the terrace, the circuit board including an installation part having a smaller thickness than the rest of the circuit board, the smaller thickness being formed along a direction parallel to the top surface of the case and perpendicular to the length of the top surface;
    a first conductive tab and a second conductive tab installed in the circuit board; and
    a temperature device installed on the installation part of the circuit board to sense the temperature of the bare cell, the temperature device electrically connecting the first conductive tab to the second conductive tab, wherein the installation part is interposed between the terrace and the temperature device, and the installation part comprises through holes penetrating the circuit board, wherein the temperature device and the terrace directly face each other via the through holes.

15. The secondary battery as claimed in claim 14, wherein the through holes are formed along a direction parallel to the top surface of the case and perpendicular to the length of the top surface.

16. The secondary battery as claimed in claim 15, further comprising a thermal conductive material layer disposed on inner surfaces of the through holes.

17. The secondary battery as claimed in claim 14, wherein the temperature device is capable of cutting an electric current path between the first and second conductive tabs if a temperature of the first or second conductive tab is higher than a predetermined level.

18. The secondary battery as claimed in claim 4, the thermal conductive material layer is filled totally in the through holes.

19. The secondary battery as claimed in claim 16, the thermal conductive material layer is filled totally in the through holes.

* * * * *